United States Patent
Cheng et al.

(10) Patent No.: US 10,062,615 B2
(45) Date of Patent: *Aug. 28, 2018

(54) STACKED NANOWIRE DEVICES

(71) Applicant: International Business Machines Corporation, Armonk, NY (US)

(72) Inventors: Kangguo Cheng, Schenectady, NY (US); Ramachandra Divakaruni, Ossining, NY (US); Juntao Li, Cohoes, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/628,821

(22) Filed: Jun. 21, 2017

(65) Prior Publication Data

US 2017/0294358 A1    Oct. 12, 2017

Related U.S. Application Data

(60) Continuation of application No. 15/207,802, filed on Jul. 12, 2016, now Pat. No. 9,735,234, which is a
(Continued)

(51) Int. Cl.
*H01L 29/78* (2006.01)
*H01L 21/8238* (2006.01)
(Continued)

(52) U.S. Cl.
CPC ............ *H01L 21/823807* (2013.01); *H01L 21/02532* (2013.01); *H01L 21/02603* (2013.01);
(Continued)

(58) Field of Classification Search
None
See application file for complete search history.

(56) References Cited

U.S. PATENT DOCUMENTS 7,892,945 B2    2/2011  Bedell et al.
8,519,479 B2    8/2013  Bangsaruntip et al.
(Continued)

OTHER PUBLICATIONS

List of IBM Patents or Patent Applications Treated as Related (Appendix P); Filed Jun. 21, 2017, 2 pages.
(Continued)

*Primary Examiner* — Minh-Loan Tran
(74) *Attorney, Agent, or Firm* — Cantor Colburn LLP

(57) ABSTRACT

A semiconductor device comprises first stack of nanowires arranged on a substrate comprises a first nanowire and a second nanowire, the second nanowire is arranged substantially co-planar in a first plane with the first nanowire the first nanowire and the second nanowire arranged substantially parallel with the substrate, a second stack of nanowires comprises a third nanowire and a fourth nanowire, the third nanowire and the fourth nanowire arranged substantially co-planar in the first plane with the first nanowire, and the first nanowire and the second nanowire comprises a first semiconductor material and the third nanowire and the fourth nanowire comprises a second semiconductor material, the first semiconductor material dissimilar from the second semiconductor material.

18 Claims, 21 Drawing Sheets

Related U.S. Application Data division of application No. 15/015,347, filed on Feb. 4, 2016, now Pat. No. 9,484,267.

(51) Int. Cl.

| | |
|---|---|
| *H01L 29/06* | (2006.01) |
| *H01L 29/423* | (2006.01) |
| *H01L 29/786* | (2006.01) |
| *H01L 27/092* | (2006.01) |
| *H01L 21/02* | (2006.01) |
| *H01L 21/3065* | (2006.01) |
| *H01L 21/225* | (2006.01) |
| *H01L 21/324* | (2006.01) |
| *H01L 29/66* | (2006.01) |
| *H01L 29/417* | (2006.01) |

(52) U.S. Cl.
CPC ...... *H01L 21/2251* (2013.01); *H01L 21/3065* (2013.01); *H01L 21/324* (2013.01); *H01L 21/823814* (2013.01); *H01L 21/823828* (2013.01); *H01L 21/823878* (2013.01); *H01L 27/092* (2013.01); *H01L 29/0649* (2013.01); *H01L 29/0673* (2013.01); *H01L 29/41791* (2013.01); *H01L 29/42392* (2013.01); *H01L 29/66545* (2013.01); *H01L 29/66795* (2013.01); *H01L 29/66803* (2013.01); *H01L 29/7831* (2013.01); *H01L 29/7856* (2013.01); *H01L 29/78618* (2013.01); *H01L 29/78651* (2013.01); *H01L 29/78684* (2013.01); *H01L 29/78696* (2013.01); *H01L 29/785* (2013.01)

(56) References Cited

U.S. PATENT DOCUMENTS

| | | | |
|---|---|---|---|
| 9,484,267 | B1 | 11/2016 | Cheng et al. |
| 9,735,234 | B1* | 8/2017 | Cheng ................ H01L 29/0673 |
| 2008/0135949 | A1 | 6/2008 | Lo et al. |
| 2016/0118304 | A1* | 4/2016 | Zang ............... H01L 21/823807 |
| | | | 438/694 |
| 2017/0025314 | A1* | 1/2017 | Witters ................. B82Y 10/00 |

OTHER PUBLICATIONS

Kangguo Cheng, et al. "Stacked Nanowire Devices," U.S. Appl. No. 15/207,802, filed Jul. 12, 2016.

* cited by examiner

STACKED NANOWIRE DEVICES

DOMESTIC AND/OR FOREIGN PRIORITY

This application is a continuation of U.S. application Ser. No. 15/207,802, titled "STACKED NANOWIRE DEVICES," filed Jul. 12, 2016, which is a divisional of U.S. application Ser. No. 15/015,347, titled "STACKED NANOWIRE DEVICES," filed Feb. 4, 2016, the contents of which are incorporated by reference herein in their entirety.

BACKGROUND

The present invention generally relates to complimentary metal-oxide semiconductors (CMOS) and metal-oxide-semiconductor field-effect transistors (MOSFET), and more specifically, to nanowire technology.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Since the fin provides a three dimensional surface for the channel region, a larger channel length may be achieved in a given region of the substrate as opposed to a planar FET device.

As CMOS scales to smaller dimensions, nanowire devices provide advantages. A nanowire is often suspended above the substrate by source/drain regions or the gate stack. Since the nanowire is suspended, the channel region of a nanowire device have four surfaces, or 360 degrees of exposed area. The gate stack may be formed around the channel region of the nanowire to form a gate-all-around-device. The nanowire may provide even more surface area and greater channel length than a finFET device or planar FET device in a given region of a substrate. Nanowire FETs may be formed from stacked nanowires provide even greater efficiency. Stacked nanowires provide, for example, increased drive current within a given layout area.

Gate spacers form an insulating film along gate sidewalls. Gate spacers may also initially be formed along sacrificial gate sidewalls in replacement gate technology. The gate spacers are used to define source/drain regions in active areas of a semiconductor substrate located adjacent to the gate.

Device scaling drives the semiconductor industry, which reduces costs, decreases power consumption, and provides faster devices with increased functions per unit area. Improvements in optical lithography have played a major role in device scaling. However, optical lithography has limitations for minimum dimensions, which are determined by the wavelength of the irradiation.

SUMMARY

According to an embodiment of the present invention, a method for fabricating a semiconductor device comprises forming a first layer comprises a first semiconductor material on a substrate. The method includes forming a second layer comprises a second semiconductor material on the first layer. The method includes forming a third layer comprises the first semiconductor material on the second layer. The method includes removing portions of the first layer, the second layer, and the third layer to form a stack of nanowires. The method includes forming a first sacrificial gate stack and a second sacrificial gate stack over the stack of nanowires. The method includes patterning a first mask over the first sacrificial gate stack and a first portion of the stack of nanowires. The method includes removing exposed portions of the second layer. The method includes depositing an insulator material over an exposed second portion of the stack of nanowires. The method includes removing the first mask and the first sacrificial gate stack to expose a first channel region of a portion of the stack of nanowires. The method includes performing an annealing process.

According to another embodiment of the present invention, a method for fabricating a semiconductor device comprises forming a first layer comprises a first semiconductor material on a substrate. The method includes forming a second layer comprises a second semiconductor material on the first layer. The method includes forming a third layer comprises the first semiconductor material on the second layer. The method includes removing portions of the first layer, the second layer, and the third layer to form a stack of nanowires. The method includes forming a first sacrificial gate stack and a second sacrificial gate stack over the stack of nanowires. The method includes removing exposed portions of the second layer. The method includes depositing an insulator material over exposed portions of the stack of nanowires. The method includes patterning a first mask over the first sacrificial gate stack and a first portion of the stack of nanowires, removing exposed insulator material from a second portion of the stack of nanowires, epitaxially growing a first source/drain region on the second portion of the stack of nanowires, and performing an annealing process operative to drive atoms from the first source/drain region into a second channel region.

According to yet another embodiment of the present invention, a semiconductor device comprises first stack of nanowires arranged on a substrate comprises a first nanowire and a second nanowire, the second nanowire is arranged substantially co-planar in a first plane with the first nanowire the first nanowire and the second nanowire arranged substantially parallel with the substrate, a second stack of nanowires comprises a third nanowire and a fourth nanowire, the third nanowire and the fourth nanowire arranged substantially co-planar in the first plane with the first nanowire, and the first nanowire and the second nanowire comprises a first semiconductor material and the third nanowire and the fourth nanowire comprises a second semiconductor material, the first semiconductor material dissimilar from the second semiconductor material.

BRIEF DESCRIPTION OF THE DRAWINGS

FIG. 3 illustrates a side view of a semiconductor-on-insulator (SOI) substrate and alternating layers of semiconductor materials arranged on the SOI substrate.

FIG. 4 illustrates a side view of a stack of nanowires that has been formed on the insulator layer.

FIG. 5 illustrates a front view of the stack of nanowires, which includes a shallow trench isolation (STI) (isolation) region.

FIG. 6 illustrates a front view of the resultant structure following the formation of sacrificial (dummy) gates and over portions of the stacks of nanowires.

FIG. 7 illustrates a front view following the patterning of a first resist mask over the sacrificial gate and the second stack of nanowires FIG. 8 illustrates a front view of the resultant structure following the removal of the first resist mask (of FIG. 7) and the deposition of a liner layer and an inter-level dielectric layer.

FIG. 9 illustrates a front view following the patterning of a second resist mask over the sacrificial gate and the first stack of nanowires.

FIG. 10 illustrates a front view of the resultant structure following a thermal mixing anneal process that diffuses the germanium in the second nanowires (of FIG. 9) into the first nanowires (of FIG. 9) of the second stack of nanowires.

FIG. 11 illustrates a front view following the formation of a sacrificial gate over exposed portions of the nanowires fills the cavity (of FIG. 10).

FIG. 12 illustrates a front view following the patterning of a third resist mask over the nanowires.

FIG. 13 illustrates a front view of the resultant structure following the formation of source/drain regions.

FIG. 14 illustrates a front view of the resultant structure following the removal of the sacrificial gates and (of FIG. 13) to form cavities and that expose the channel regions of the first nanowires 408 and the nanowires.

FIG. 15 illustrates a front view of the resultant structure following the formation of replacement metal gate stacks (gate stacks).

FIG. 16 illustrates a front view of the spacers, the sacrificial gate stacks, the insulator layer, and the stacks of nanowires.

FIG. 17 illustrates a front view of the resultant structure following a selective isotropic etching process that removes exposed portions of the second semiconductor material nanowires (second nanowires).

FIG. 18 illustrates a front view of the resultant structure following the deposition of a liner layer and an inter-level dielectric layer over exposed portions of first semiconductor material nanowires (first nanowires).

FIG. 19 illustrates a front view of the resultant structure following the deposition and patterning of a lithographic mask over the first stack of nanowires.

FIG. 20 illustrates a front view following an epitaxial growth process that forms source/drain regions.

FIG. 21 illustrates a front view following the formation of a mask and a selective etching process that removes the liner layer and an inter-level dielectric layer to expose the first stack of nanowires.

FIG. 22 a front view following an epitaxial growth process that forms source/drain regions over exposed portions of the first stack of nanowires.

FIG. 23 illustrates a front view following the removal of the mask (of FIG. 21) and the deposition and planarization of an inter-level dielectric layer.

FIG. 24 illustrates a front view following the removal of the remaining exposed portions of the liner layer and an inter-level dielectric layer.

FIG. 25 illustrates a front view following the formation of replacement metal gate stacks (gate stacks).

DETAILED DESCRIPTION

Nanowire semiconductor devices include a nanowire formed from a semiconductor material. The channel region of the nanowire is often suspended above a substrate such that the gate materials surround the channel region of the nanowire. This forms a gate-all-around device where the gate is arranged 360 degrees about the channel region. Nanowires may be stacked vertically to increase the density of the field effect transistor (FET) devices on the substrate. Metal oxide semiconductor field effect transistor (MOSFET) devices such as p-type (pFET) and n-type (nFET) devices are often formed from different semiconductor materials. For example, nFET devices having a silicon channel region and pFET devices having silicon germanium channel regions offer performance advantages in complementary metal oxide semiconductor (CMOS) devices.

Stacked nanowire devices may be formed by, for example, forming alternating layers of semiconductor materials on a substrate. For example, alternating layers of silicon germanium and silicon may be formed on a substrate and patterned into a stack of nanowires using, for example, lithographic patterning and etching process such as, for example, reactive ion etching (RIE) or another suitable etching process. During the fabrication process, the nanowires in the stack of nanowires may be isolated by, for example, performing a selective anisotropic etching process that undercuts the selected nanowires to expose the selected nanowires. For example, a nanowire stack having alternating layers of silicon germanium and silicon may be etched to selectively remove the silicon germanium nanowires such that suspended silicon nanowires remain having a channel region that is exposed 360 degrees such that subsequently a gate stack may be formed that surrounds the channel region of the silicon nanowires in a gate-all-around arrangement.

Figure 1:
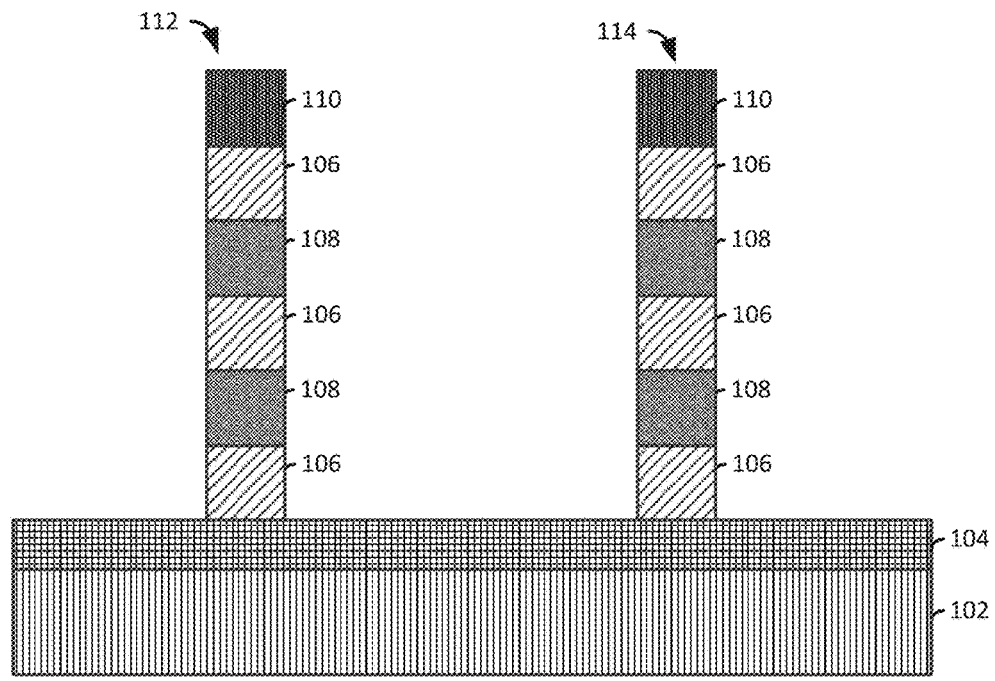
FIG. 1 illustrates an example of side view of stacks of nanowires and that have been patterned on a substrate.

In this regard, FIG. 1 illustrates an example of side view of stacks of nanowires 112 and 114 that have been patterned on a substrate. The substrate in the example is a semiconductor-on-insulator (SOI) substrate, including a semiconductor substrate 102 and an insulator layer 104 arranged on the semiconductor substrate 102. It should be appreciated, however, that other types of bulk substrates and SOI substrates could also be used. For example, the substrate 102 may be a bulk substrate comprising silicon, germanium, silicon germanium, silicon carbide, or a III-V compound semiconductor (e.g., GaAs), a II-VI compound semiconductors (e.g., ZnSe). The stacks of nanowires 112 and 114 include alternating layers of semiconductor materials and cap layers 110. In the illustrated example, the nanowires 112 include a silicon germanium material 106 while the nanowires 114 include a silicon material 112.

Figure 2:
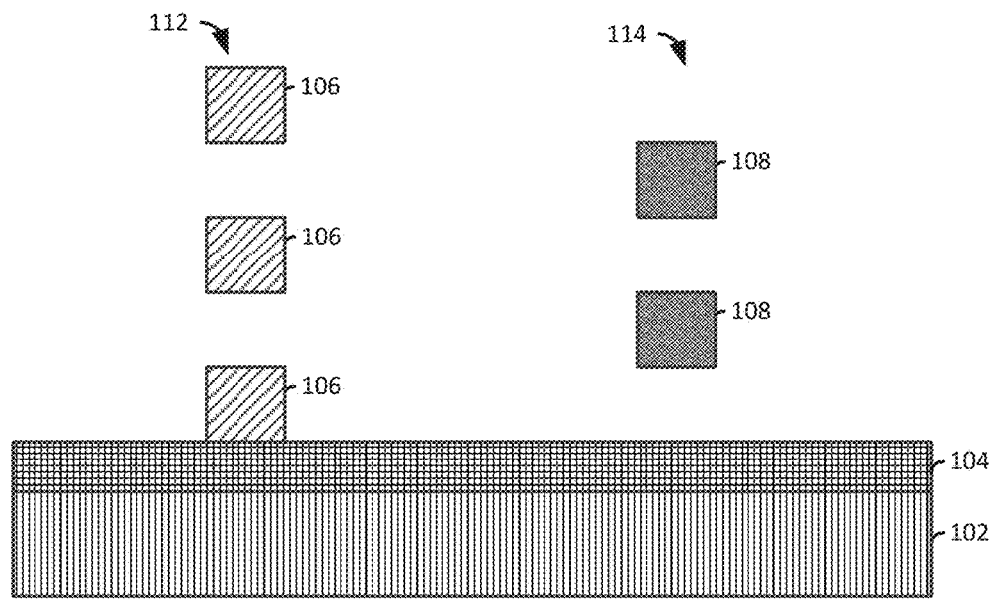
FIG. 2 illustrates a side view of the stacks of nanowires and following etching processes that selectively remove semiconductor materials.

FIG. 2 illustrates a side view of the stacks of nanowires 112 and 114 following etching processes that selectively remove semiconductor materials. In FIG. 2, the silicon material 108 has been removed from the stack of nanowires 112, and in the stack of nanowires 114, the silicon germanium material 106 has been removed. Since there is dissimilar number of silicon germanium material 106 and silicon materials 108, the stack of nanowires 112 includes three nanowires while the stack of nanowires 114 includes two nanowires.

The arrangement shown in FIG. 2 is often undesirable because a FET device formed using the stack of nanowires 112, which includes three nanowires would have a larger active region than a FET device formed using the stack of nanowires 114, which only includes two nanowires. The stacks of nanowires 112 and 114 also have dissimilar heights, which may also be undesirable.

FIGS. 3-15 illustrate an exemplary method for fabricating stacked nanowire FET devices.

Figure 3:
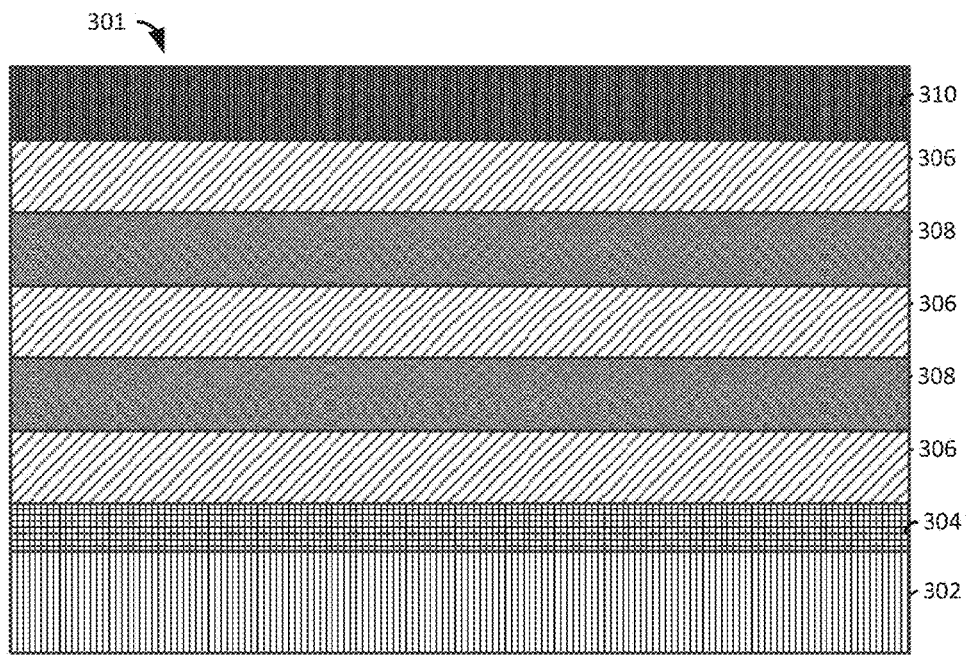
FIGS. 3-15 illustrate an exemplary method for fabricating stacked nanowire FET devices.

FIG. 3 illustrates a side view of a semiconductor-on-insulator (SOI) substrate and alternating layers of semiconductor materials arranged on the SOI substrate. The SOI substrate includes a semiconductor layer 302 and an insulator layer 304 arranged on the semiconductor layer 302.

The insulator layer 304 may include, for example, a buried oxide (BOX) material or other suitable insulator materials. Buried oxide materials include, for example, an oxide, such as silicon dioxide, or a nitride such as silicon nitride. The thickness of insulator layer 304 generally varies and is not intended to be limited. In one aspect, the thickness of the insulator layer 304 is in a range from about 10 nm to about 1000 nm.

The semiconductor layer 302 and insulator layer 304 may be formed using any suitable process or combination of processes including, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD).

A stack of nanowire material layers 301 is arranged on the insulator layer 304. The nanowire material layers in the illustrated embodiment include a first nanowire material layer 306 and a second nanowire material layer 308 arranged on the first nanowire material layer 306. The stack of nanowire material layers 301 may include any number of alternating nanowire material layers 306 and 308. In the illustrated embodiment, the first nanowire material layer 306 includes a silicon material and the second nanowire material layer 308 includes a silicon germanium material. The stack of nanowire material layers 301 may be formed by any suitable process. In an embodiment, the first silicon germanium nanowire material layer 308 may be grown by an epitaxial growth process on first silicon nanowire material layer 306. In another embodiment, the first silicon nanowire material layer may be grown by an epitaxial growth process on the first silicon germanium nanowire material layer which is silicon germanium layer on insulator layer (SGOI). A hardmask layer 310 is arranged on the stack of nanowire material layers 301.

Figure 4:
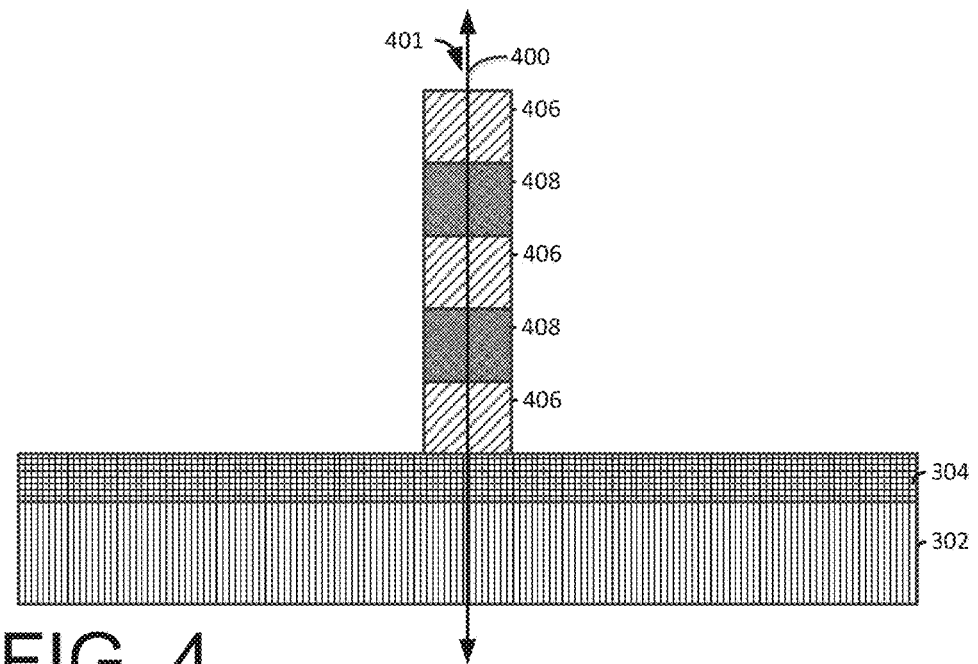

FIG. 4 illustrates a side view of a stack of nanowires 401 that has been formed on the insulator layer 304. The stack of nanowires 401 may be formed by any suitable lithographic patterning and etching process such as, for example, a sidewall image transfer process or a reactive ion etching (RIE) process that removes exposed portions of the stack of nanowire material layers 301 and exposes portions of the insulator layer 304 to form first semiconductor material nanowires (first nanowires) 406 and second semiconductor material nanowires (second nanowires) 408. The stack of nanowires 401 are arranged substantially coplanar in a first plane indicated by the line 400.

Figure 5:
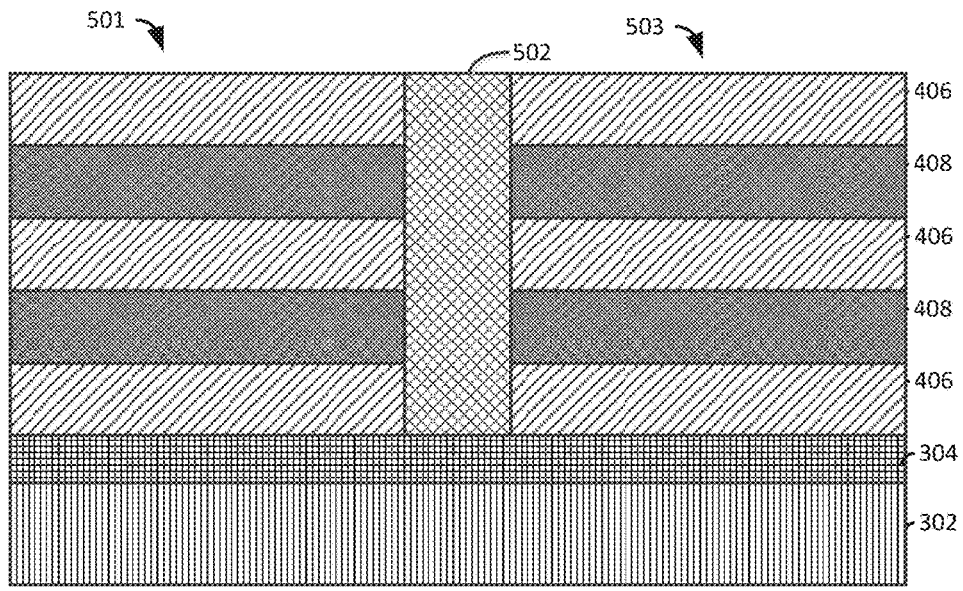

FIG. 5 illustrates a front view of the stack of nanowires 401, which includes a shallow trench isolation (STI) (isolation) region 502. The STI region 502 may be formed by, any suitable process including, for example, lithography or etching to form trenches, and then filling the trenches with an insulating material, such as silicon dioxide. Before filling the insulating material, an optional liner layer (not shown) can be deposited by a suitable deposition process such as, for example, the nitride liner may be applied by any suitable method, including, but not limited to, CVD, PECVD, and ALD. The optional liner layer may include, for example, a nitride material. The optional liner layer protects the semiconductor nanowire material and substantially inhibits oxygen from the STI oxide entering the nanowires during the thermal mixing anneal process (discussed below). In the illustrated embodiment, at least one isolation region is a shallow trench isolation region. However, in alternate exemplary embodiments, the isolation region 502 may be a trench isolation region, a field oxide isolation region (not shown), or any other suitable region. The isolation region 502 provides isolation between neighboring gate structure regions, and may be used when the neighboring gates have opposite conductivities, e.g., nFETs and pFETs. As such, the isolation region 502 separates an nFET device region from a pFET device region. The formation of the STI region 502 defines two stacks of nanowires a first stack of nanowires 501 and a second stack of nanowires 503.

Figure 6:
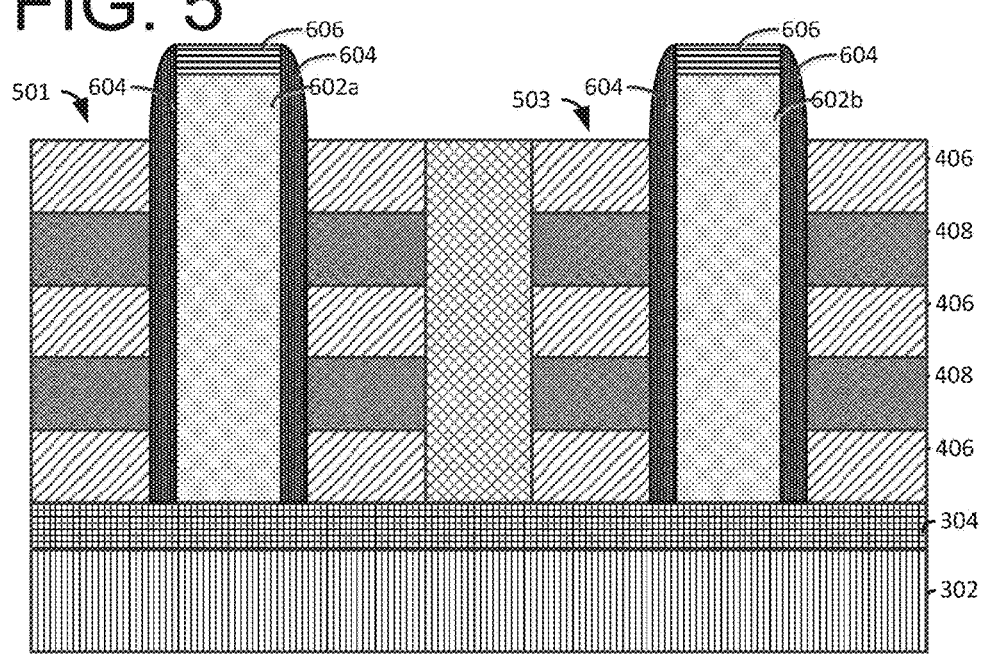

FIG. 6 illustrates a front view of the resultant structure following the formation of sacrificial (dummy) gates 602a and 602b over portions of the stacks of nanowires 501 and 503. The sacrificial gates 602a and 602b in the exemplary embodiment are formed by depositing a layer of sacrificial gate material such as, for example, polycrystalline silicon (polysilicon) material or another suitable sacrificial gate material.

The layer sacrificial gate material (not shown) may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon nitride (SiN), SiOCN, or SiBCN or an oxide material is deposited on the layer of sacrificial gate material to form a gate hard mask or sacrificial gate cap 606. Hardmask layer may be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching is performed to remove exposed portions of the hardmask layer and the layer of sacrificial gate material form the sacrificial gates 602a and 602b and the gate caps 606.

In FIG. 6, spacers 604 are formed adjacent to the sacrificial gate stacks 602a and 602b. The spacers 604 in the illustrated embodiment are formed by depositing a layer of spacer material (not shown) over the exposed portions of the insulator layer 304, the stacks of nanowires 501 and 503, and the sacrificial gates 602a and 602b. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a deposition process, for example, chemical vapor deposition (CVD) or physical vapor deposition (PVD). Following the deposition of the layer of spacer material, a suitable anisotropic etching process such as, for example, a reactive ion etching process is performed to remove portions of the layer of spacer material and form the spacers 604.

Figure 7:
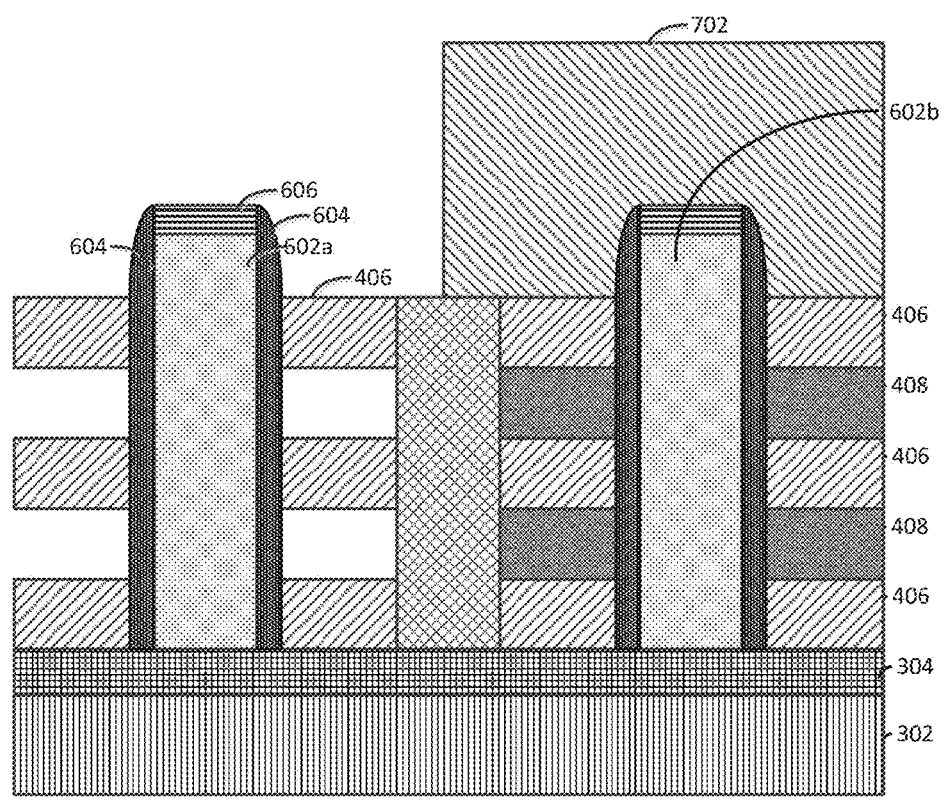

FIG. 7 illustrates a front view following the patterning of a first block mask 702 over the sacrificial gate 602b and the second stack of nanowires 503. The mask 702 can be a soft mask, i.e., photoresist formed by photolithography. If, alternately, a hard mask is used, a photoresist material is applied over the masking layer to effect patterning the hard mask layer. In the illustrated embodiment, the mask 702 is a softmask (photoresist) formed by photolithography. Suitable resist masks include photoresists, electron-beam resists, ion-beam resists, X-ray resists, and etch resists. The resist may a polymeric spin on material or a polymeric material.

Following the patterning of the first resist mask 702, a selective isotropic etching process is performed that is selective to the first nanowire material layer 306. The etching process removes exposed portions of the second nanowire material layer 308. The removal of the exposed portions of the second nanowire material layer 308 exposes the tops, sides, and bottoms of the nanowires 406.

Figure 8:
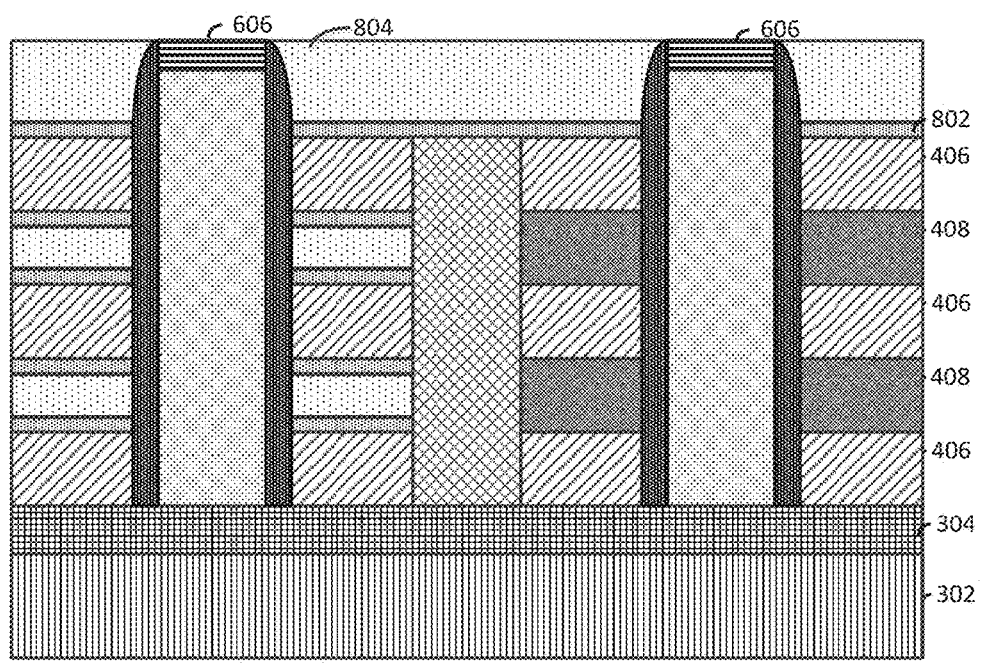

FIG. 8 illustrates a front view of the resultant structure following the removal of the first resist mask 702 (of FIG. 7) and the deposition of a liner layer 802 and an inter-level dielectric layer 804. In this regard, the first resist mask 702 may be removed by, for example, an ashing process. The ashing process may be used to remove a photoresist material, amorphous carbon, or organic planarization (OPL) layer. Ashing is performed using a suitable reaction gas, for example, $O_2$, $N_2$, H2/N2, $O_3$, $CF_4$, or any combination thereof.

Once the first resist mask 702 is removed, the liner layer 802 is deposited by a suitable deposition process such as, for example, the nitride liner 802 may be applied by any suitable method, including, but not limited to, CVD, PECVD, and ALD. The liner layer 802 may include, for example, a nitride material. The liner layer 802 protects the underlying semiconductor material when the inter-level dielectric layer 804 is formed.

The inter-level dielectric layer 804 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 802 is deposited by a deposition process, including, but not limited to CVD, PVD, plasma enhanced CVD, atomic layer deposition (ALD), evaporation, chemical solution deposition, or like processes. Following the deposition of the inter-level dielectric layer 802, a planarization process such as, for example, chemical mechanical polishing is performed that exposes the gate caps 606.

Figure 9:
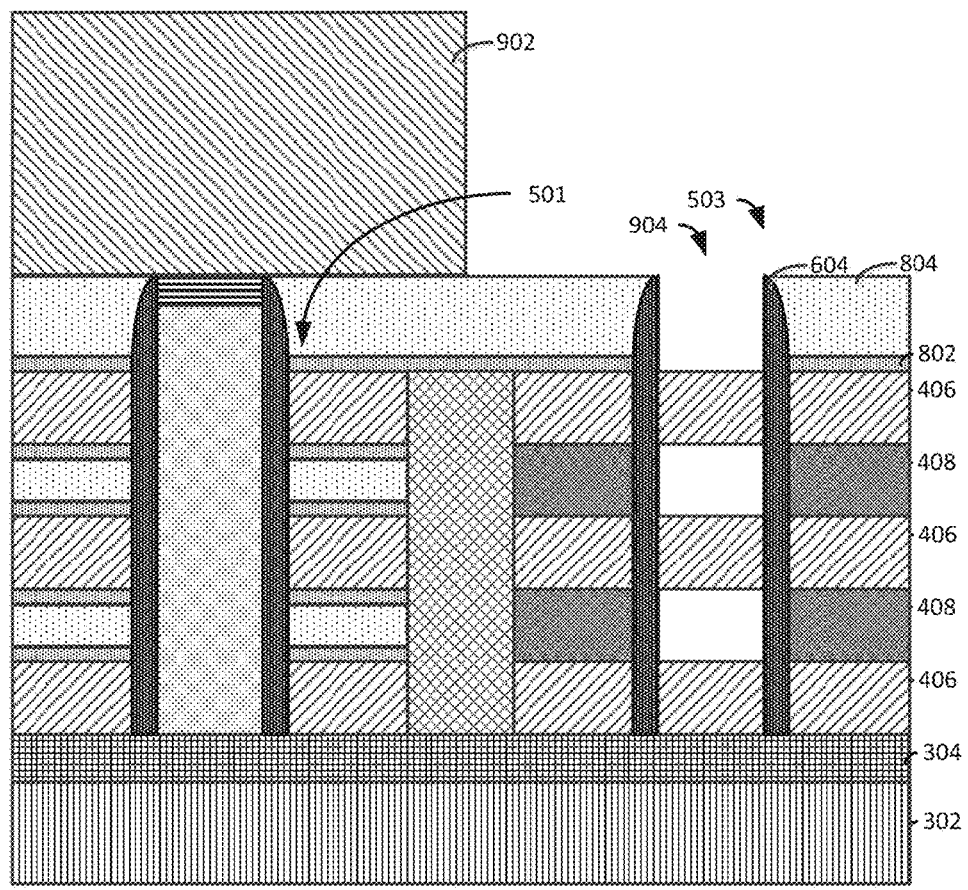

FIG. 9 illustrates a front view following the patterning of a second resist mask 902 over the sacrificial gate 602a and the first stack of nanowires 501. The second resist mask 902 is formed in a similar manner as the first resist mask 702 (of FIG. 7) described above. The sacrificial gate 602b may be removed by performing a dry etch process, for example, RIE, followed by a wet etch process. The wet etch process is selective to (will not substantially etch) the gate spacers 604 and the inter-level dielectric layer 804. The chemical etch process may include, but is not limited to, hot ammonia or tetramethylammonium hydroxide (TMAH). After the second resist mask 902 is formed, a cavity 904 is formed by removing the sacrificial gate 602b (of FIG. 8). The cavity 904 exposes channel regions of the first nanowires 406 of the second stack of nanowires 503.

Figure 10:
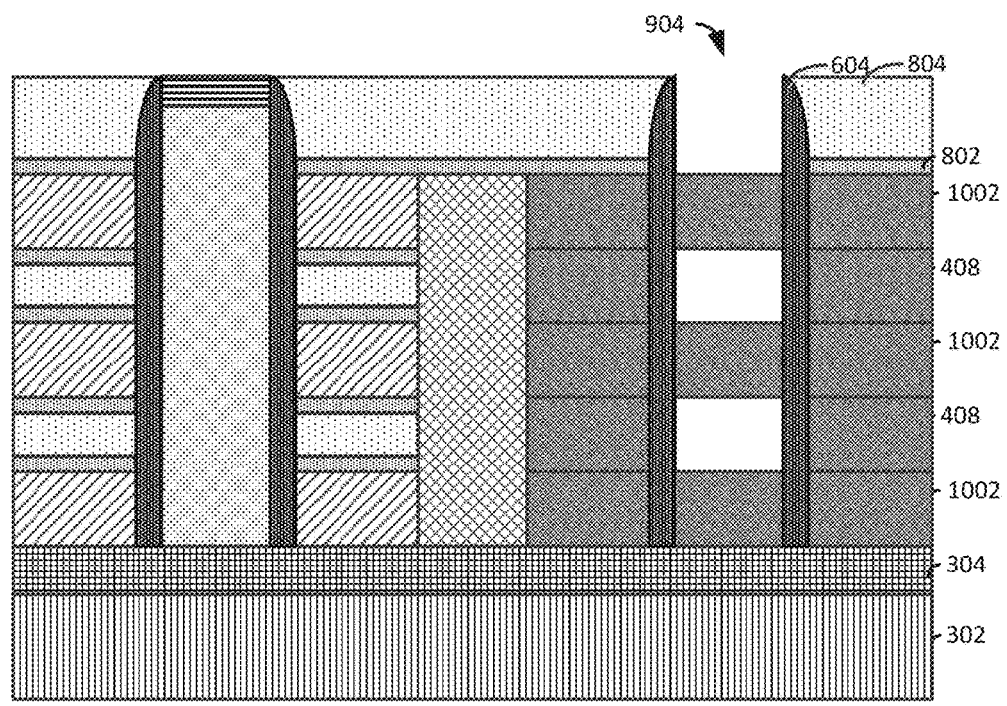

FIG. 10 illustrates a front view of the resultant structure following a thermal mixing anneal process that diffuses the germanium in the second nanowires 408 (of FIG. 9) into the first nanowires 406 (of FIG. 9) of the second stack of nanowires 503. The thermal mixing and anneal process is performed in an inert gas at a temperature of about 800° C. to about 1250° C. The anneal process results in nanowires 1002 that include silicon germanium material in the source/drain region and channel regions. At this point of the manufacturing process, there may be no thermal budget constraint and a high temperature furnace anneal may be used to ensure a homogeneous distribution of germanium atoms in the nanowires 1002 and 408. In other words, both the nanowires 1002 and 408 may have a homogenous distribution of germanium atoms after the second stack of nanowires 503 undergoes the thermal annealing.

Figure 11:
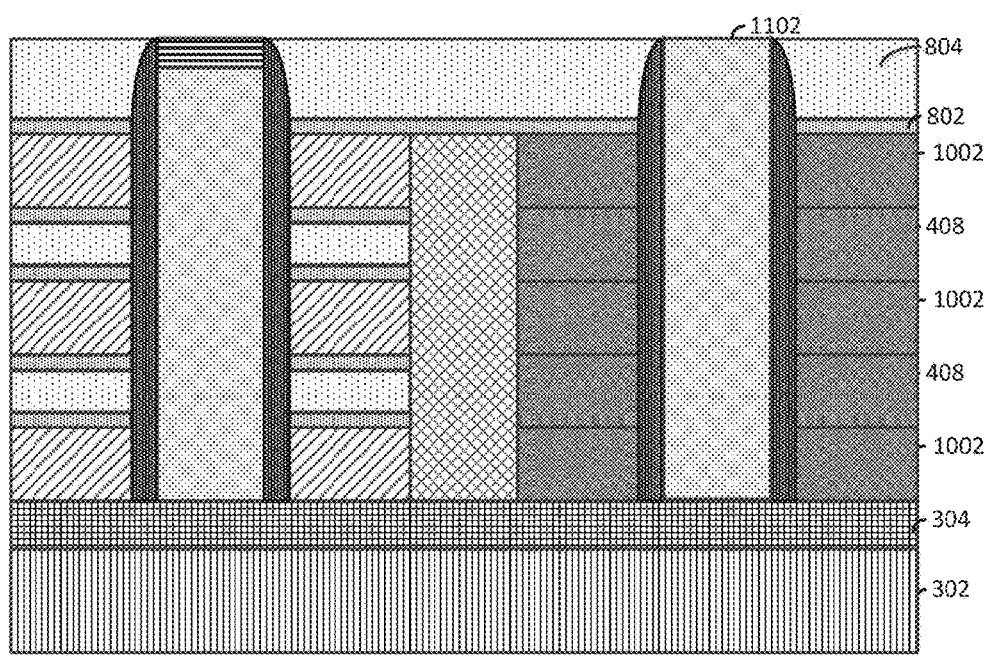

FIG. 11 illustrates a front view following the formation of a sacrificial gate 1102 over exposed portions of the nanowires 1002 that 1104 fills the cavity 904 (of FIG. 10).

Figure 12:
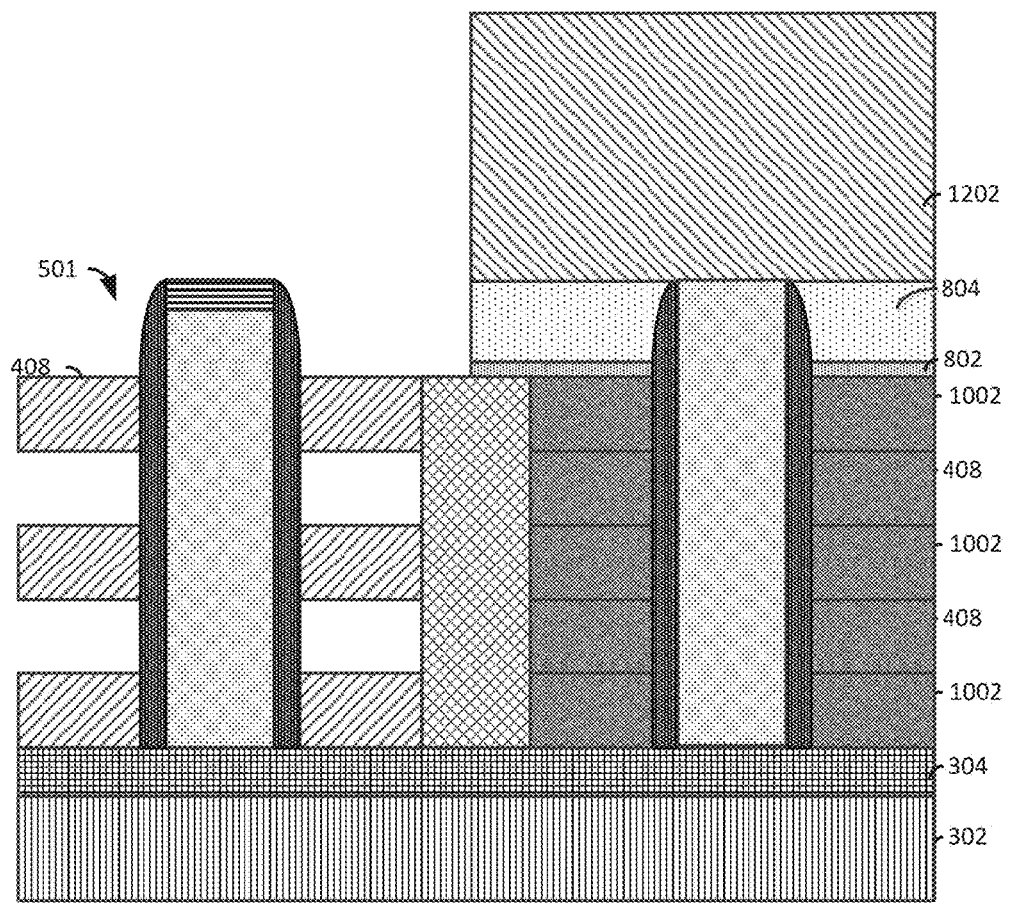

FIG. 12 illustrates a front view following the patterning of a third resist mask 1202 over the nanowires 1002 followed by a selective wet etching process that removes exposed portions of the first liner layer 802, and the inter-level dielectric layer 804 to expose the second nanowires 408 of the first stack of nanowires 501.

Figure 13:
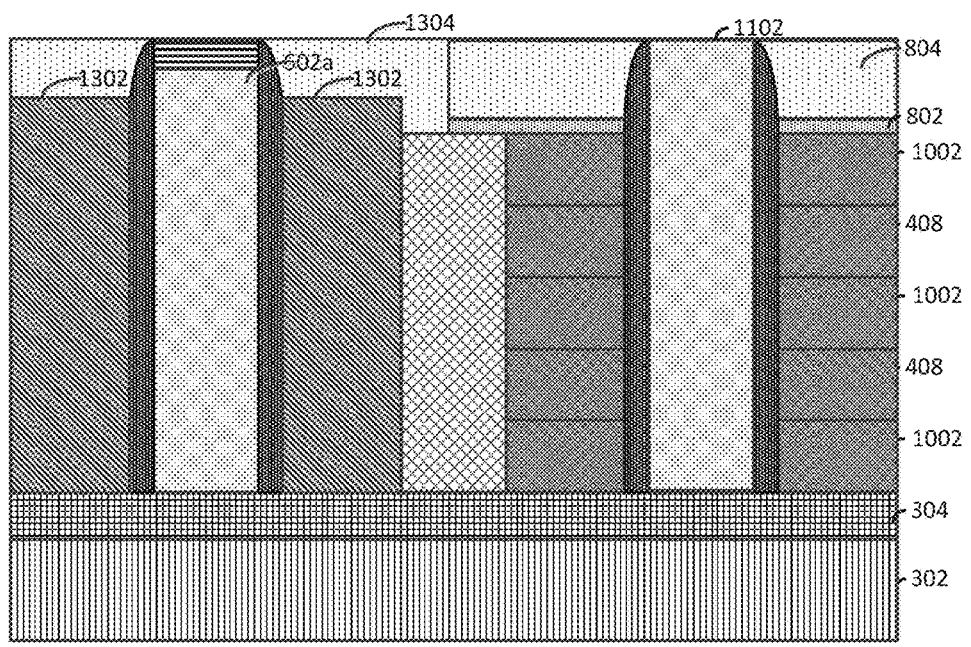

FIG. 13 illustrates a front view of the resultant structure following the formation of source/drain regions 1302. The source/drain regions 1302 are formed by an epitaxial growth process that deposits a crystalline overlayer of semiconductor material onto the exposed crystalline seed material of the exposed second nanowires 408 of the first stack of nanowires 501 to form the source/drain regions 1302.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor. In the illustrated embodiment, the source/drain regions are formed from a dissimilar material than the nanowires 1002 (e.g., silicon).

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Following the formation of the source/drain regions 1302, a third inter-level dielectric material layer 1304 may be deposited and planarized using a similar deposition and planarization process as described above.

Figure 14:
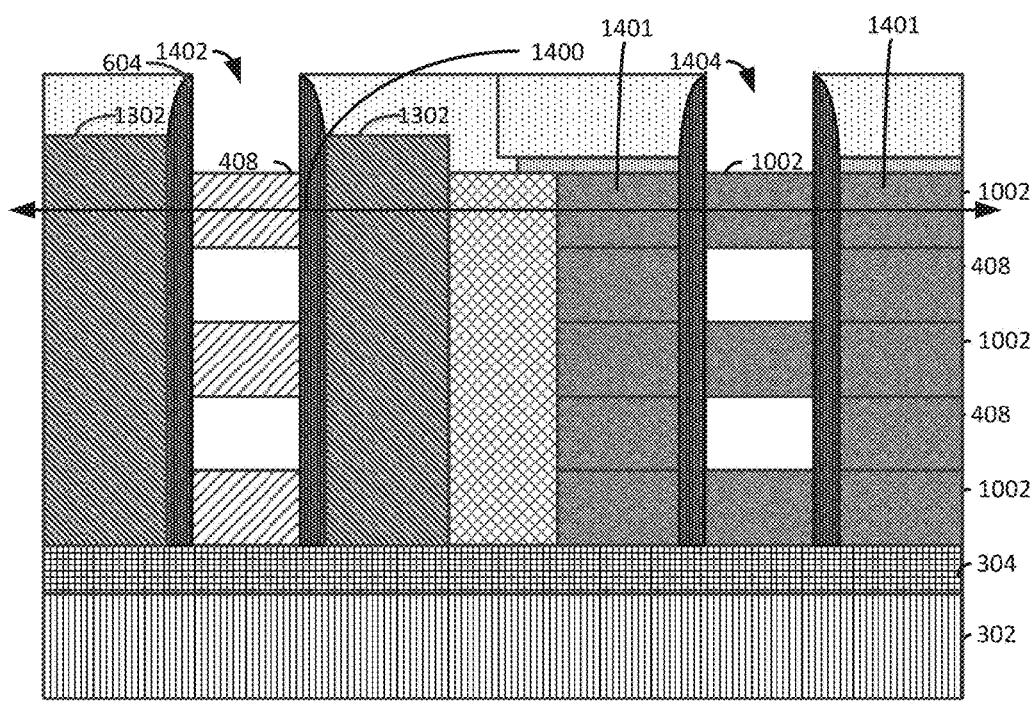

FIG. 14 illustrates a front view of the resultant structure following the removal of the sacrificial gates 602a and 1102 (of FIG. 13) to form cavities 1402 and 1404 that expose the channel regions of the first nanowires 408 and the nanowires 1002. The sacrificial gates 602a and 1102 may be removed by performing a dry etch process, for example, RIE, followed by a wet etch process. The wet etch process is selective to (will not substantially etch) the spacers 604 and the inter-level dielectric material. The chemical etch process may include, but is not limited to, hot ammonia or tetramethylammonium hydroxide (TMAH). The nanowires 408 and 1002 are arranged substantially co-planar in a second plane shown by the line 1400.

In some embodiments the source/drain regions 1401 of the nanowires 1002 and the second nanowires 408 in the second stack of nanowires 503 may be doped with dopants using, for example an ion implantation process.

Figure 15:
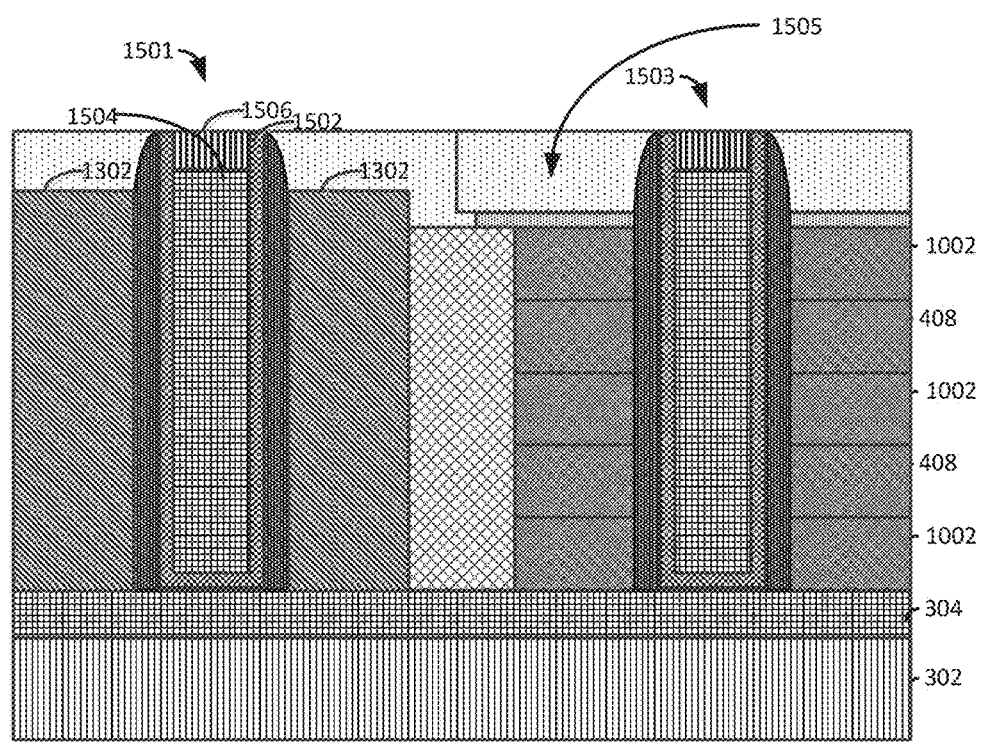

FIG. 15 illustrates a front view of the resultant structure following the formation of replacement metal gate stacks (gate stacks) 1501 and 1503. The gate stacks 1501 and 1503 include high-k metal gates formed, for example, by filling the cavities 1402 and 1404 with one or more dielectric materials 1502, one or more workfunction metals 1504, and one or more metal gate conductor materials 1506. The gate dielectric material(s) 1502 can be a dielectric material having a dielectric constant greater than 3.9, 7.0, or 10.0. Non-limiting examples of suitable materials for the dielectric materials 1502 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric materials 1502 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 1504 may be disposed over the gate dielectric material. The type of work function metal(s) 1504 depends on the type of transistor and may differ between the nFET and pFET devices. Non-limiting examples of suitable work function metals 1504 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor material(s) 1506 is deposited over the gate dielectric materials 1502 and work function metal(s) 1504 to form the gate stacks 1504. Non-limiting examples of suitable conductive metals include aluminum (Al), platinum (Pt), gold (Au), tungsten (W), titanium (Ti), or any combination thereof. The gate conductor material(s) 1506 may be deposited by a suitable deposition process, for example, CVD, PECVD, PVD, plating, thermal or e-beam evaporation, and sputtering.

Following the deposition of the gate dielectric materials 1502, the work function metal(s) 1504, and the gate conductor material(s) 1506, planarization process, for example, chemical mechanical planarization (CMP), is performed to remove the overburden of the deposited gate materials and form the gate stacks 1501 and 1503.

After the gate stacks 1502 and 1503 are formed, additional insulating material (not shown) may be deposited over the devices. The insulating material may be patterned to form cavities (not shown) that expose portions of the source/drain regions 1302 and 1505 and the gate stacks 1501 and 1503. The cavities may be filled by a conductive material (not shown) and, in some embodiments, a liner layer (not shown) to form conductive contacts (not shown).

FIGS. 16-25 illustrate an alternate exemplary method for fabricating stacked nanowire FET devices.

Figure 16:
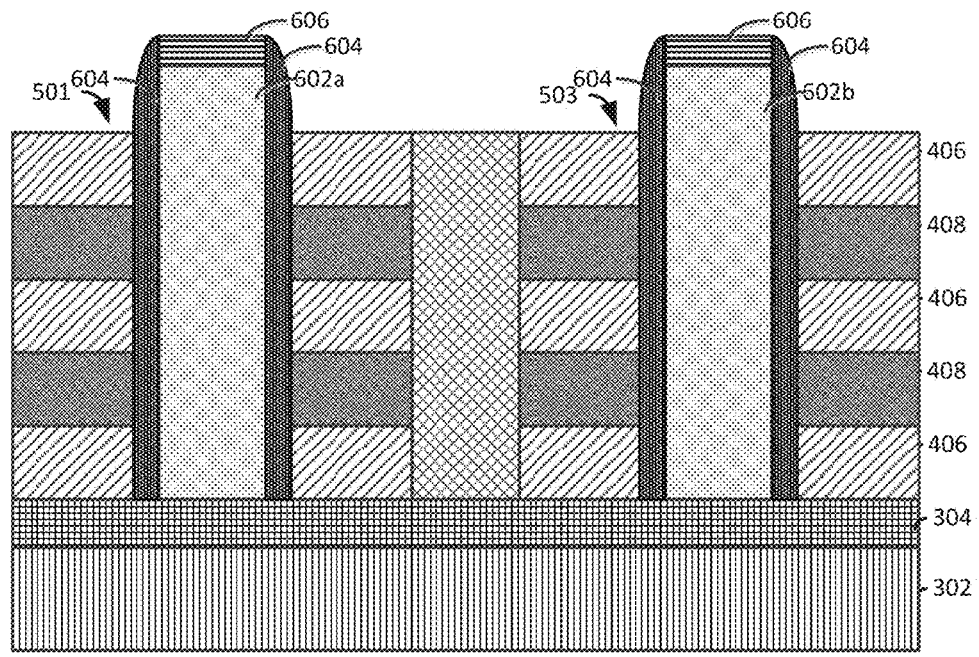
FIGS. 16-25 illustrate an alternate exemplary method for fabricating stacked nanowire FET devices.

FIG. 16 illustrates a front view of the spacers 604, the sacrificial gate stacks 602a and 602b, the insulator layer 304, and the stacks of nanowires 501 and 503 as described above in FIG. 6. The arrangement shown in FIG. 16 may be formed using similar methods as described above in FIGS. 1-6.

Figure 17:
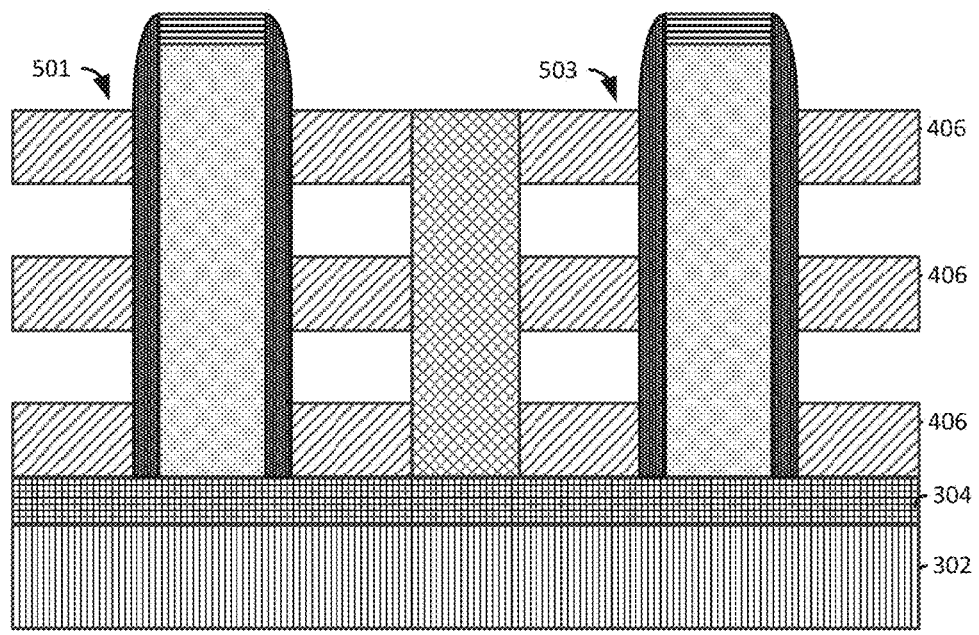

FIG. 17 illustrates a front view of the resultant structure following a selective isotropic etching process that removes exposed portions of the second semiconductor material nanowires (second nanowires) 408.

Figure 18:
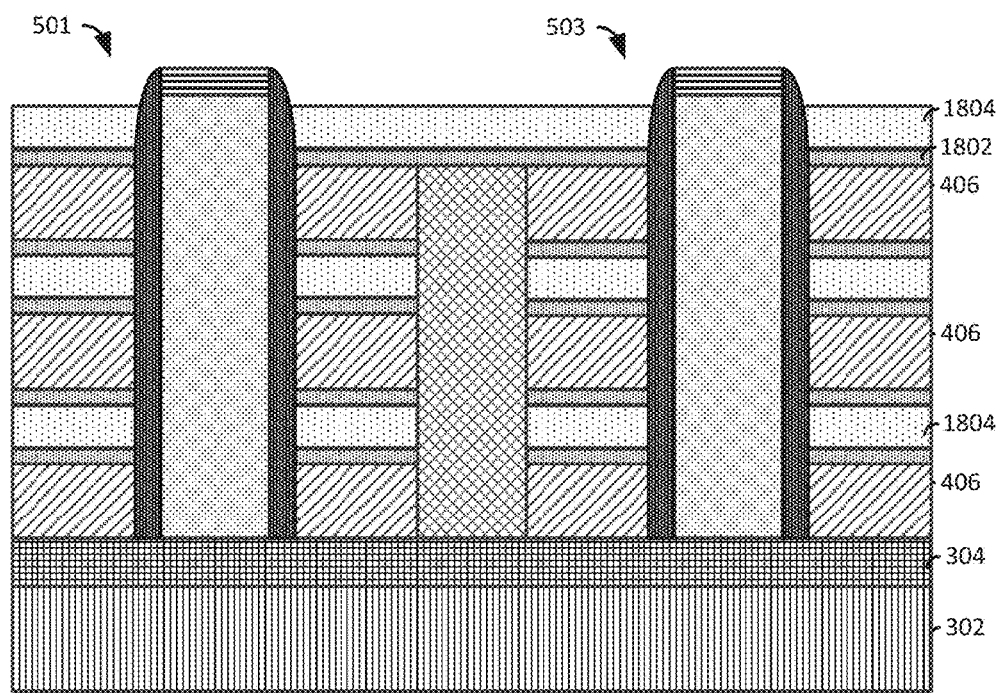

FIG. 18 illustrates a front view of the resultant structure following the deposition of a liner layer 1802 and an inter-level dielectric layer 1804 over exposed portions of first semiconductor material nanowires (first nanowires) 406.

Figure 19:
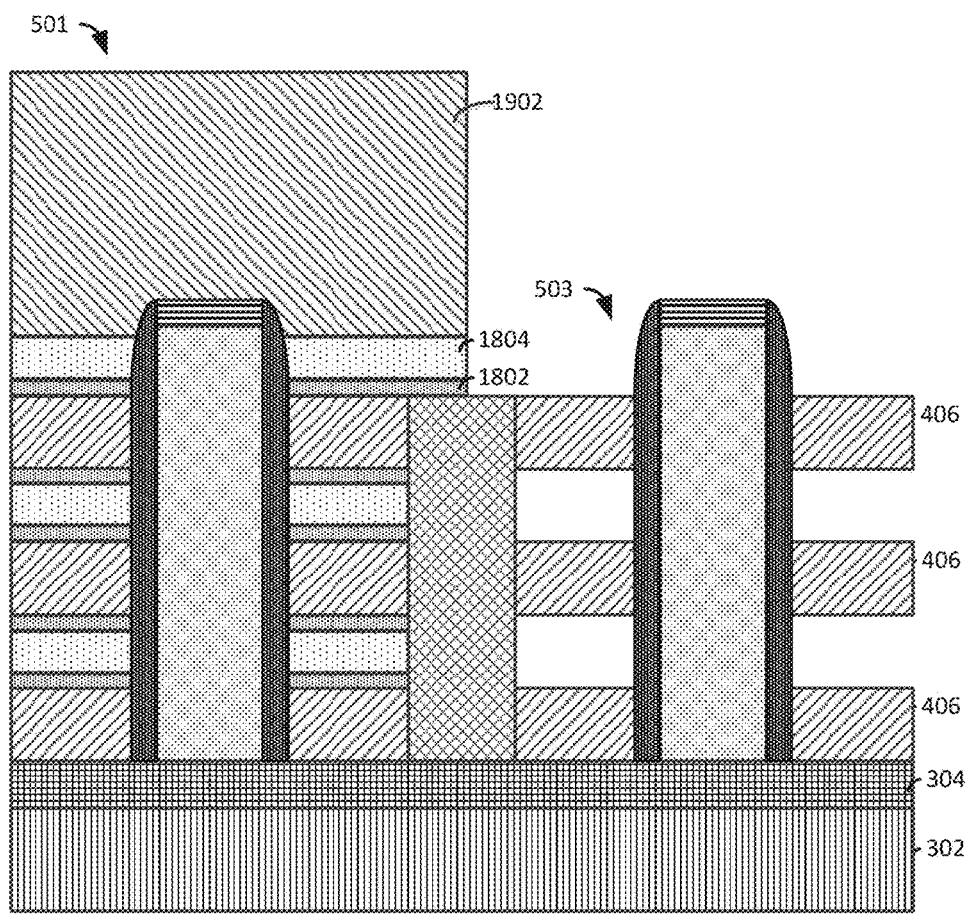

FIG. 19 illustrates a front view of the resultant structure following the deposition and patterning of a lithographic mask 1902 over the first stack of nanowires 501. After the lithographic mask 1902 is formed, a selective isotropic etching process is performed to remove exposed portions of the liner layer 1802 and an inter-level dielectric layer 1804 from the second stack of nanowires 503.

Figure 20:
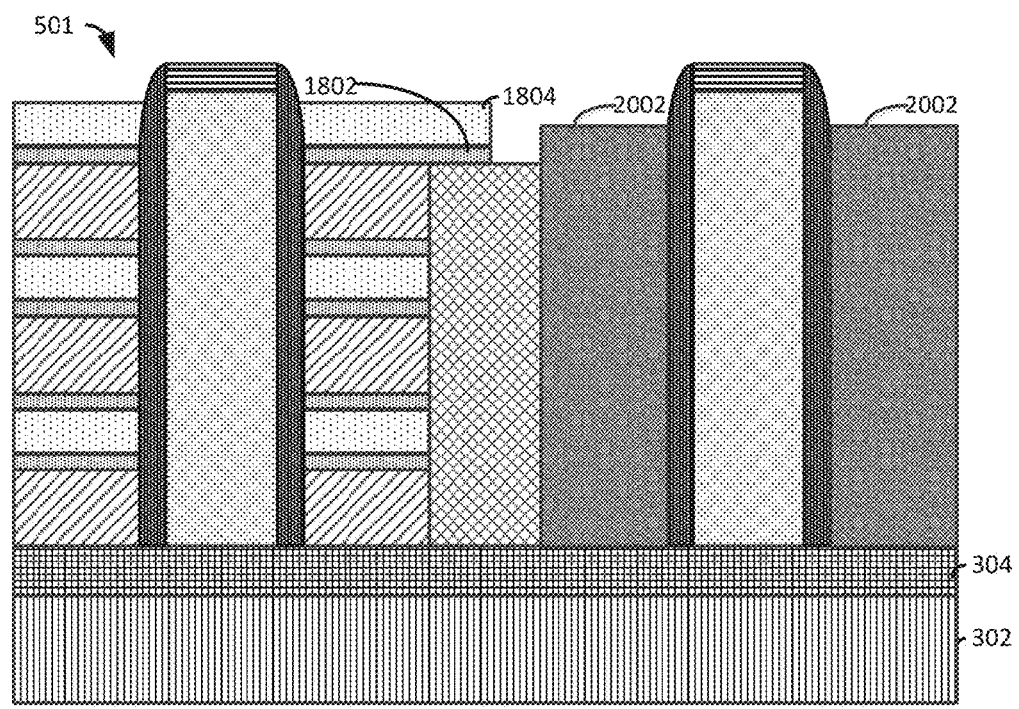

FIG. 20 illustrates a front view following an epitaxial growth process that forms source/drain regions 2002 over exposed portions of the second stack of nanowires 503 (of FIG. 19). The source/drain regions 2002 may be doped with a suitable dopant during the epitaxial growth process. In alternate exemplary embodiments, the source/drain regions 2002 may be formed by, for example an ion implantation process.

Figure 21:
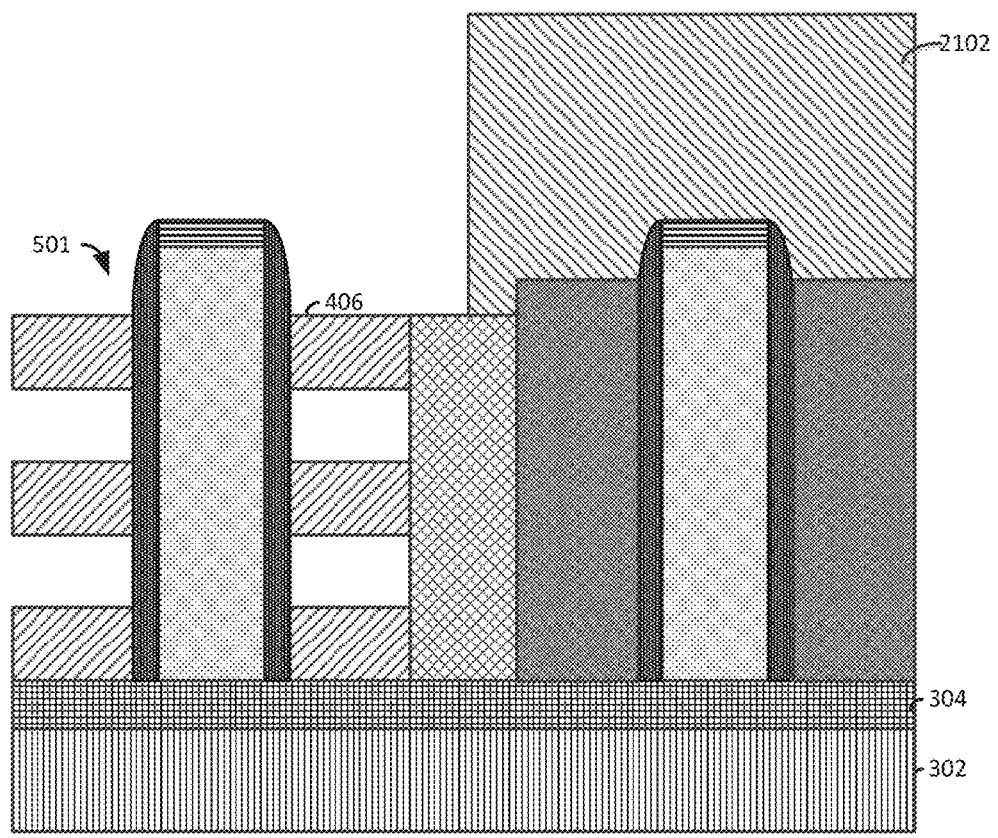

FIG. 21 illustrates a front view following the formation of a mask 2102 and a selective etching process that removes the liner layer 1802 and an inter-level dielectric layer 1804 to expose the first stack of nanowires 501.

Figure 22:
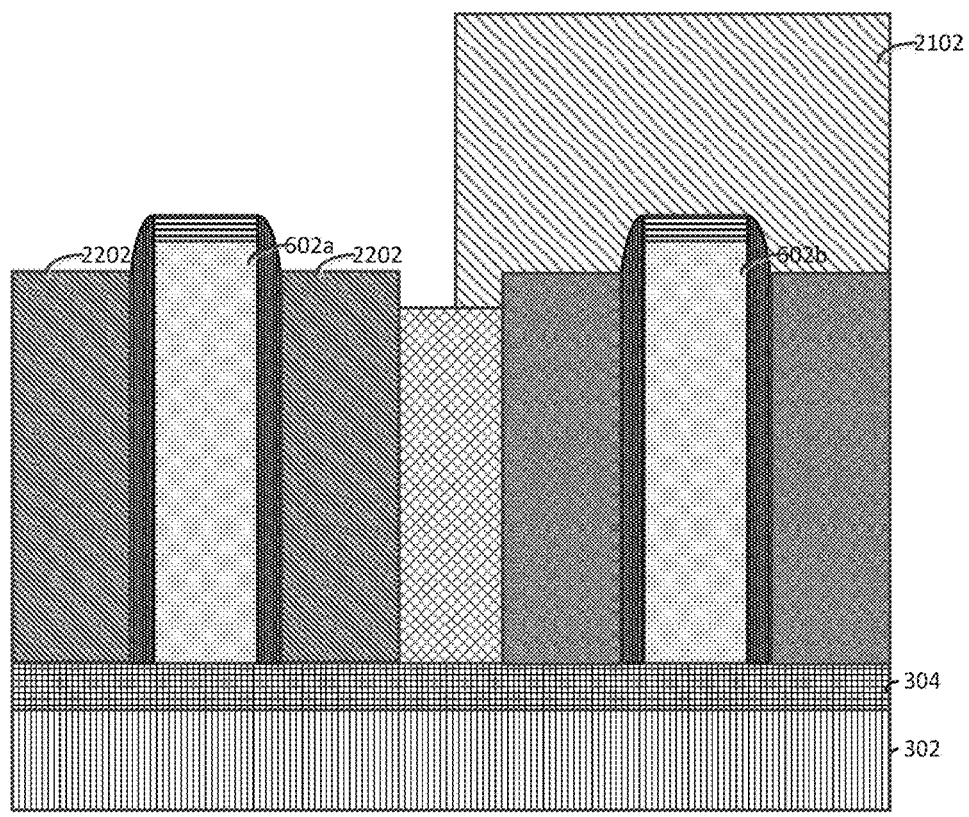

FIG. 22 a front view following an epitaxial growth process that forms source/drain regions 2202 over exposed portions of the first stack of nanowires 501 (of FIG. 19). The source/drain regions 2202 may be doped with a suitable dopant during the epitaxial growth process. In alternate exemplary embodiments, the source/drain regions 2202 may be doped by, for example an ion implantation process.

Figure 23:
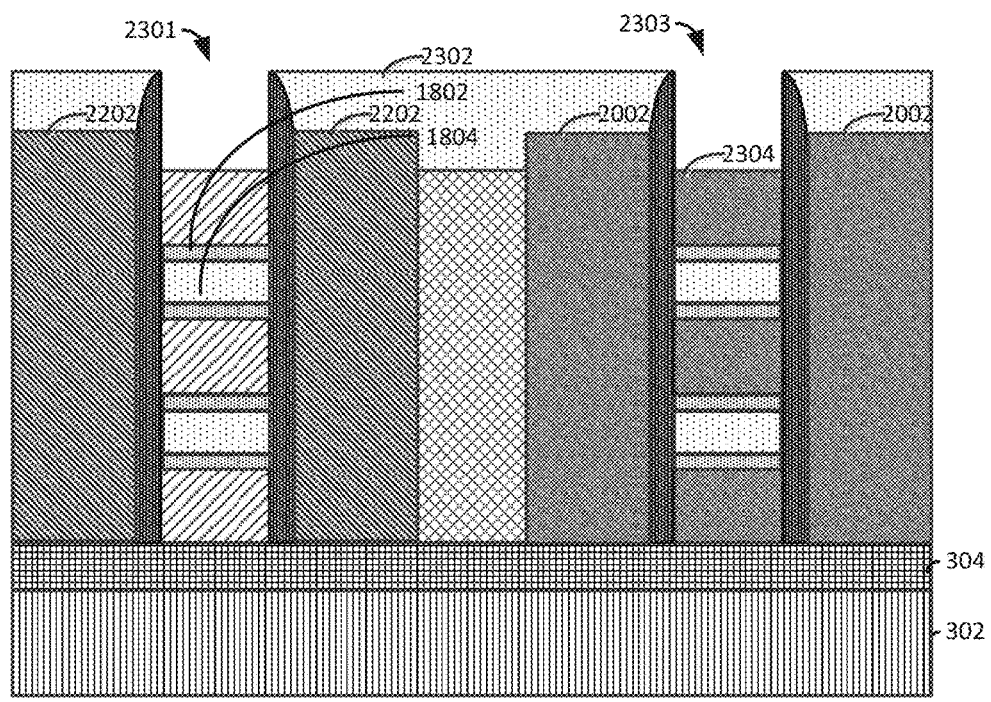

FIG. 23 illustrates a front view following the removal of the mask 2102 (of FIG. 21) and the deposition and planarization of an inter-level dielectric layer 2302. Following the planarization of the inter-level dielectric layer 2302, the sacrificial gate stacks 602a and 602b (of FIG. 22) are removed to form cavities 2301 and 2303. Following the formation of the cavities 2301 and 2303, an annealing process is performed to drive germanium atoms from the source/drain regions 2002 into the channel regions 2304 exposed in the cavity 2303.

Figure 24:
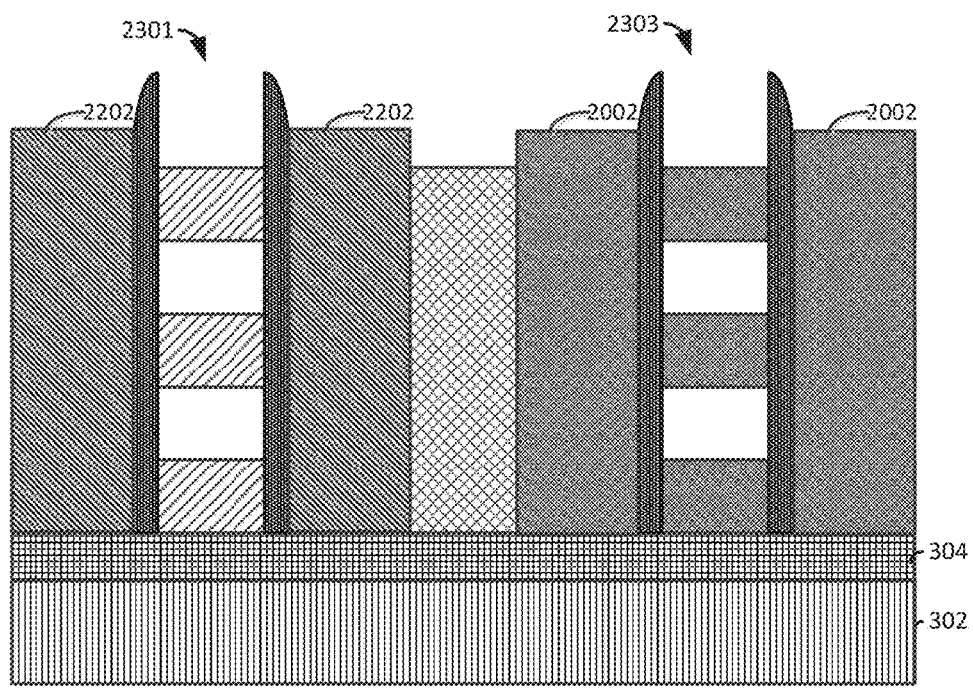

FIG. 24 illustrates a front view following the removal of the remaining exposed portions of the liner layer 1802 and an inter-level dielectric layer 1804 (of FIG. 23) in the cavities 2301 and 2301.

Figure 25:
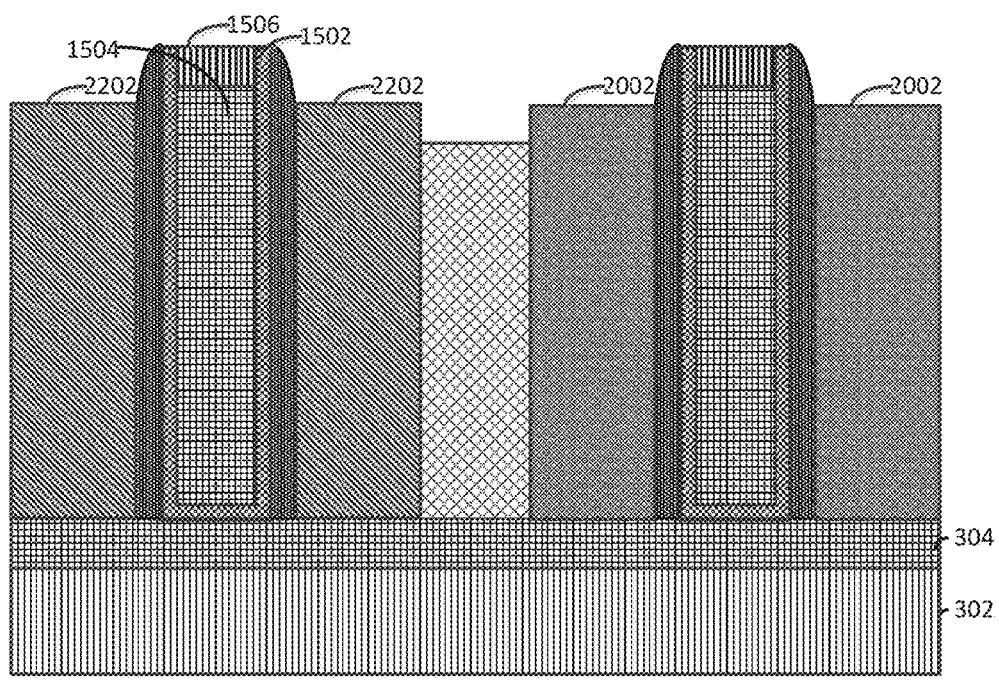

FIG. 25 illustrates a front view following the formation of replacement metal gate stacks (gate stacks) 1501 and 1503 as described above in FIG. 15.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a first stack of nanowires arranged on a substrate comprising a first nanowire and a second nanowire, the first nanowire and the second nanowire arranged substantially parallel with the substrate;
a second stack of nanowires arranged on the substrate comprising a third nanowire and a fourth nanowire, the third nanowire and the fourth nanowire arranged substantially parallel with the substrate, the third nanowire arranged substantially co-planar in a first plane with the first nanowire, the fourth nanowire arranged substantially co-planar in a second plane with the second nanowire; and
the first nanowire and the second nanowire comprising a first semiconductor material and the third nanowire and the fourth nanowire comprising a second semiconductor material, the first semiconductor material dissimilar from the second semiconductor material.

2. The device of claim 1, wherein the first semiconductor material includes silicon.

3. The device of claim 1, wherein the second semiconductor material includes silicon germanium.

4. The device of claim 1, further comprising a first gate stack arranged over a channel region of the first stack of nanowires.

5. The device of claim 4, further comprising spacers arranged adjacent to the first gate stack.

6. The device of claim 5, further comprising a source/drain region arranged adjacent to the spacers.

7. The device of claim 6 wherein the first nanowire extends through the spacer and into the source/drain region.

8. The device of claim 1, further comprising a second gate stack arranged over a channel region of the second stack of nanowires.

9. The device of claim 8, further comprising spacers arranged adjacent to the second gate stack.

10. The device of claim 9, further comprising a source/drain region arranged adjacent to the spacers.

11. A semiconductor device comprising:
a first stack of nanowires arranged on a substrate comprising a first nanowire vertically stacked over a second nanowire;
a second stack of nanowires arranged on the substrate comprising a third nanowire vertically stacked over a fourth nanowire, the third nanowire arranged substantially co-planar in a first plane with the first nanowire, the first plane substantially parallel to a surface of the substrate; and
the first nanowire and the second nanowire comprising a first semiconductor material and the third nanowire and the fourth nanowire comprising a second semiconductor material, the first semiconductor material dissimilar from the second semiconductor material.

12. The device of claim 11, wherein the first semiconductor material includes silicon.

13. The device of claim 11, wherein the second semiconductor material includes silicon germanium.

14. The device of claim 11, further comprising a first gate stack arranged over a channel region of the first nanowire and a channel region of the second nanowire.

15. The device of claim 14, further comprising spacers arranged adjacent to the first gate stack.

16. The device of claim 15, further comprising a source/drain region arranged adjacent to the spacers.

17. The device of claim 16, wherein the first nanowire extends through the spacer and into the source/drain region.

18. The device of claim 14, further comprising a second gate stack arranged over a channel region of the second stack of nanowires.

* * * * *